US009425186B2

(12) United States Patent
Chen

(10) Patent No.: US 9,425,186 B2
(45) Date of Patent: Aug. 23, 2016

(54) ELECTROSTATIC DISCHARGE PROTECTION CIRCUIT

(71) Applicant: ISSC TECHNOLOGIES CORP., Hsinchu (TW)

(72) Inventor: Che-Hong Chen, Hsinchu (TW)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/657,505

(22) Filed: Mar. 13, 2015

(65) Prior Publication Data

US 2015/0262992 A1    Sep. 17, 2015

(30) Foreign Application Priority Data

Mar. 14, 2014   (TW) .............................. 103109429 A

(51) Int. Cl.
*H01L 27/08* (2006.01)
*H01L 23/552* (2006.01)
*H01L 27/02* (2006.01)

(52) U.S. Cl.
CPC ........ *H01L 27/0266* (2013.01); *H01L 27/0255* (2013.01)

(58) Field of Classification Search
CPC .............................. H01L 27/08; H01L 23/552
See application file for complete search history.

(56) References Cited

U.S. PATENT DOCUMENTS

| 4,896,243 A | 1/1990 | Chatterjee et al. |
| 4,939,616 A | 7/1990 | Rountree |
| 5,895,940 A * | 4/1999 | Kim .............................. 257/173 |
| 2014/0197450 A1* | 7/2014 | He et al. ........................ 257/133 |

OTHER PUBLICATIONS

Feng et al., "A Comparison Study of ESD Protection for RFIC'S:Performance vs. Parasitics", IEEE Rado Frequency Integrated Circuits Symposium, 2000, pp. 235-238.
(Continued)

*Primary Examiner* — Marc Armand
(74) *Attorney, Agent, or Firm* — Slayden Grubert Beard PLLC

(57) ABSTRACT

The present invention discloses an electrostatic discharge protection circuit, comprising a diode and a N-type metal-oxide-semiconductor (NMOS) transistor. The diode locating on a N-well comprises an high P-doping concentration region and an nonadjacent high N-doping concentration region. The NMOS transistor, locating on a P-well, comprises a drain, a source and a gate, and the drain and the source are formed by the high N-doping concentration region. Wherein the P-well further comprises a high P-doping concentration region near the source, the drain of the NMOS is electrically connected to the high N-doping concentration region of the diode, the source of the NMOS and the adjacent high P-doping concentration region are electrically connected to a ground, the gate of the NMOS transistor electrically connected to a trigger point. Accordingly, the electrostatic discharge protection circuit has a low parasitic capacitance, wide operating voltage range and high electrostatic discharge (ESD) capability for resolving the problems about the ESD of the RX pins.

14 Claims, 6 Drawing Sheets

(a)

(b)

(56) References Cited

OTHER PUBLICATIONS

Tsai et al., "A Multi-ESD-Path Low-Noise Amplifier With a 4.3-A TLP Current Level in 65-nm CMOS", IEEE Transactions on Microwave Theory and Techniques, Dec. 2010, pp. 4004-4011, vol. 58, No. 12.

Mergens et al., "Diode-Triggered SCR (DTSCR) for RF-ESD Protection of BiCMOS SiGe HBTs and CMOS Ultra-Thin Gate Oxides", IEDM, Dec. 8-10, 2003, pp. 21.3.1-21.3.4.

Lin et al., "Dual SCR With Low-and-Constant Parasitic Capacitance for ESD Protection in 5-GHz RF Integrated Circuits", Solid-State and Integrated Circuit Technology (ICSICT), 2010 10th IEEE International Conference on, Nov. 1-4, 2010, pp. 707-709.

Mergens et al., "Speed Optimized Diode-Triggered SCR (DTSCR) for RF ESD Protection of Ultra-Sensitive IC Nodes in Advanced Technologies", IEEE Transactions on Device and Materials Reliability, Sep. 2005, pp. 532-542, vol. 5, No. 3.

\* cited by examiner (a)

(b)

(a)

(b)

ELECTROSTATIC DISCHARGE PROTECTION CIRCUIT

BACKGROUND OF THE INVENTION

1. Field of the Invention

The present invention relates to an electrostatic discharge protection circuit, and in particular to an electrostatic discharge protection circuit using a silicon controlled rectifier (SCR), which provides a low stray capacitance, a low trigger voltage, a wide operating voltage range, and a high electrostatic discharge (ESD) capability.

2. Background

To avoid the damage of integrated circuit (IC) suffered from electrostatic discharge (ESD) during the processes of construction, production and operation, therefore, ESD protection circuit must be added on all connected path of bonding wire to conduct ESD current.

In general, the protection circuit can be divided into: diode, metal oxide semiconductor (MOS) transistor, silicon controlled rectifier (SCR), etc. Wherein, the SCR exhibits the highest ESD capability under the same condition. However, the trigger voltage of conventional SCR was high to operate. For instance, Lateral SCR (LSCR) exhibits high ESD capability, but still did not be utilized frequently due to the high trigger voltage.

In order to decrease the trigger voltage, modified circuits of SCR were presented frequently. U.S. Pat. No. 4,896,243 discloses a modified lateral SCR (MLSCR). U.S. Pat. No. 4,939,616 discloses a low voltage triggering SCR (LVTSCR). Mergens propose a dual triggered SCR as reference "Diode-triggered SCR (DTSCR) for RF-ESD protection of BiCMOS SiGe HBTs and CMOS ultra-thin gate oxides," in IEEE int. Electron Devices Meeting (IEDM) Tech. Dig., Washington, D.C., 2003, pp. 21.3.1-21.3.4.

In general, the total parasitic capacitance of connection pins between the circuit and ESD protection circuit must be smaller than 200 fF, or the high-speed transmission signal will be distorted by the delay of parasitic capacitances and cause poor circuit characteristics. For the design of high-speed transmission signal, MOS transistors are not suitable for ESD protection elements due to large parasitic capacitances. In addition, some researches proposed ESD protection elements based on small capacitances, such as H. Feng, K. Gong, and A. Z. Wang, "A comparison study of ESD protection for RFIC's: performance vs. parasitics," in IEEE MTT-S int. Microwave Symp. Dig., Boston, Mass., 2000, pp. 143-146. C. Y. Lin and M. D. Ker, "Dual SCR with low-and-constant parasitic capacitance for ESD protection in 5-GHz RF intergrated circuits," in IEEE in conf. Solid-State Integrated Circuit Tech. (ICSICT), Shanghai, 2010, pp. 707-709. M. H. Tsai, S. H. Hsu, F. L. Hsueh and C. P. Jou, "A multi-ESD-path low-noise amplifier with a 4.3-A TLP current level in 65-nm CMOS," IEEE Trans. Microw. Theory Tech., vol. 58, no. 12, pp. 4004-4011, 2010. M. P. J. Mergens, C. C. Russ, K. G. Verhaege, J. Armer, P. C. Jozwiak, R. P. Mohn, B. Keppens, and C. S. Trinh, "Speed optimized diode-triggered SCR (DTSCR) for RF ESD protection of ultra-sensitive IC nodes in advanced technologies," IEEE Trans. Device Mater. Rel., vol. 5, no. 3, pp. 532-542, 2005. As above discussion, all these ESD protection circuits were formed based on SCR due to the high conducting capability of ESD current per unit area. Therefore, a compact layout size could be used to minimize parasitic capacitances with a basic ESD resistance.

FIG. 1 shows fail circuit diagram for TC 9003F31 RX pin receiving terminal. The ESD structure protects upper circuit by a diode with high P doping concentration/N-well (P+/NW), and protects lower circuit by a diode with high N doping concentration/P-well (N+/PW). When the pins are bombarded by an operation of ESD PS-mode (i.e. PS-mode means that $V_{SS}$ terminal connects with ground, a positive ESD voltage occurs at the pins and discharges the current of $V_{SS}$ terminal. At this moment, $V_{DD}$ terminal and the other pins are floating), in an ideal situation, the ESD current should flow through the upper P+/NW diode and be led to the ground by the power clamp circuit. In fact, when voltage (V1) is higher than the threshold voltage of M1 MOS transistor, and the M1 MOS transistor will break down. Therefore, the ESD current flows through the lower circuit and burns M1 MOS transistor. FIG. 2 is the measured curve of the transmission line pulse (TLP). Moreover, M1 MOS transistor is formed based on 55 nm process, which utilizes an operated voltage of 1.2V, leading to lower breakdown voltage of M1 MOS transistor.

In the ESD protection of the RF circuit, in addition to adjust the matching circuit (including the capacitor and the inductor), uses of diodes and SCR are better methods for ESD protection. However, diodes as the ESD protection circuit can merely provide forward ESD current protection, leading to diodes broken due to the voltage overflow. With the minimization of process, the breakdown voltage of the elements becomes small and the design difficulty thus increases.

Furthermore, the RX pin has a swing signal, which will cause a carrier effect. Therefore, the trigger voltage must be higher.

According to the disadvantage of the prior art, the inventors disclose an ESD protection circuit with a low capacitor, a wide operating voltage range, and a high ESD capability for resolving the problems about the ESD of the RX pins.

BRIEF SUMMARY OF THE INVENTION

It is an objective of the present invention to provide an electrostatic discharge (ESD) protection circuit with a low capacitor, a wide operating voltage range, and a high electrostatic discharge capability for resolving the problems about the ESD of the RX pins.

To achieve the above objective, the present invention provides an ESD protection circuit, formed by a diode and a metal-oxide-semiconductor (MOS) transistor set on a semi-conducting substrate, comprising: a first well, having a first conducting mode; a second well, locating adjacent to the first well and having a second conducting mode; a first high doping concentration region, locating in the first well and having a second conducting mode, the first high doping concentration region electrically connected to a connected pad; a second high doping concentration region, locating in the first well and having a first predetermined distance from the first high doping concentration region, having a first conducting mode; a third high doping concentration region, locating in the first well and having a first conducting mode; a fourth high doping concentration region, locating in the second well and having a second predetermined distance from the third high doping concentration region, having a first conducting mode, the fourth high doping concentration region electrically connected to a ground pad; a fifth high doping concentration region, locating in the second well and locating adjacent to the fourth high doping concentration region, having a second conducting mode, the fifth high doping concentration region electrically connected to the ground pad; and an electrode, locating on a surface of the second well between the third high doping concentration region and the fourth high doping concentration region, the electrode electrically connected to a trigger point; wherein the second high doping concentration region is electrically connected to the third high doping concentration region.

According to the feature of the present invention, the first conducting mode is N-type, and the second conducting mode is P-type.

According to the feature of the present invention, a parasitic effect between the first high doping concentration region, the first well and the second well forms a first bipolar transistor, the first high doping concentration region forms as a collector of the first bipolar transistor, the first well forms as a base of the first bipolar transistor, the second well forms as an emitter of the first bipolar transistor.

According to the feature of the present invention, the second high doping concentration region and the third high doping concentration region are electrically connected to a point with high voltage.

To achieve the above objective, the present invention provides an ESD protection circuit, comprising: a diode, locating on a N-well, including a high P-doping concentration region and a nonadjacent high N-doping concentration region; a N-type metal-oxide-semiconductor (NMOS) transistor, locating on a P-well, including a drain, a source and a gate, the drain and the source formed by the high N-doping concentration region; wherein the P-well further comprises a high P-doping concentration region adjacent to the source, the drain of the NMOS is electrically connected to the high N-doping concentration region of the diode, the source of the NMOS and the adjacent high P-doping concentration region are electrically connected to a ground, the gate of the NMOS transistor electrically connected to a trigger point.

According to the feature of the present invention, the drain of the NMOS transistor and the high N-doping concentration region of the diode are electrically connected to a point with high voltage.

According to the feature of the present invention, a parasitic effect between the high P-doping concentration region of the diode, the N-well, the P-well and the source of the NMOS transistor forms a SCR.

To sum up the above arguments, the electrostatic discharge protection circuit according to the invention presents the advantages including of:

Having a low parasitic capacitor for resolving the problems about the ESD of the RX pins.

Having a wide operating voltage range and high electrostatic discharge (ESD) capability.

These and many other advantages and features of the present invention will be readily apparent to those skilled in the art from the following drawings and detailed descriptions.

BRIEF DESCRIPTION OF THE DRAWINGS

All the objects, advantages, and novel features of the invention will become more apparent from the following detailed descriptions when taken in conjunction with the accompanying drawings.

DETAILED DESCRIPTION OF THE INVENTION

Although the invention has been explained in relation to several preferred embodiments, the accompanying drawings and the following detailed descriptions are the preferred embodiment of the present invention. It is to be understood that the following disclosed descriptions will be examples of present invention, and will not limit the present invention into the drawings and the special embodiment.

Figure 1:
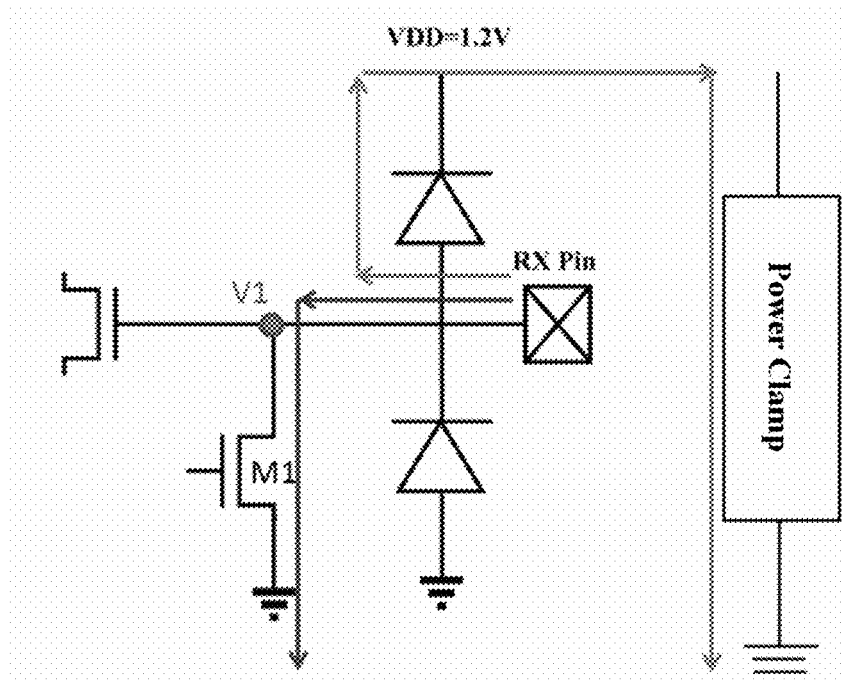
FIG. 1 shows a fail circuit diagram for TC 9003F31 RX pin receiving terminal.
Figure 2:
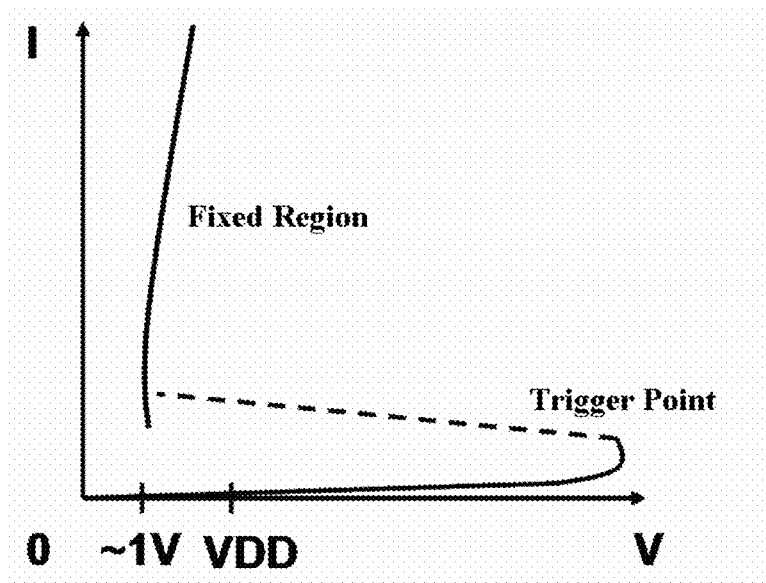
FIG. 2 the measured curve of the transmission line pulse (TLP)
Figure 3:
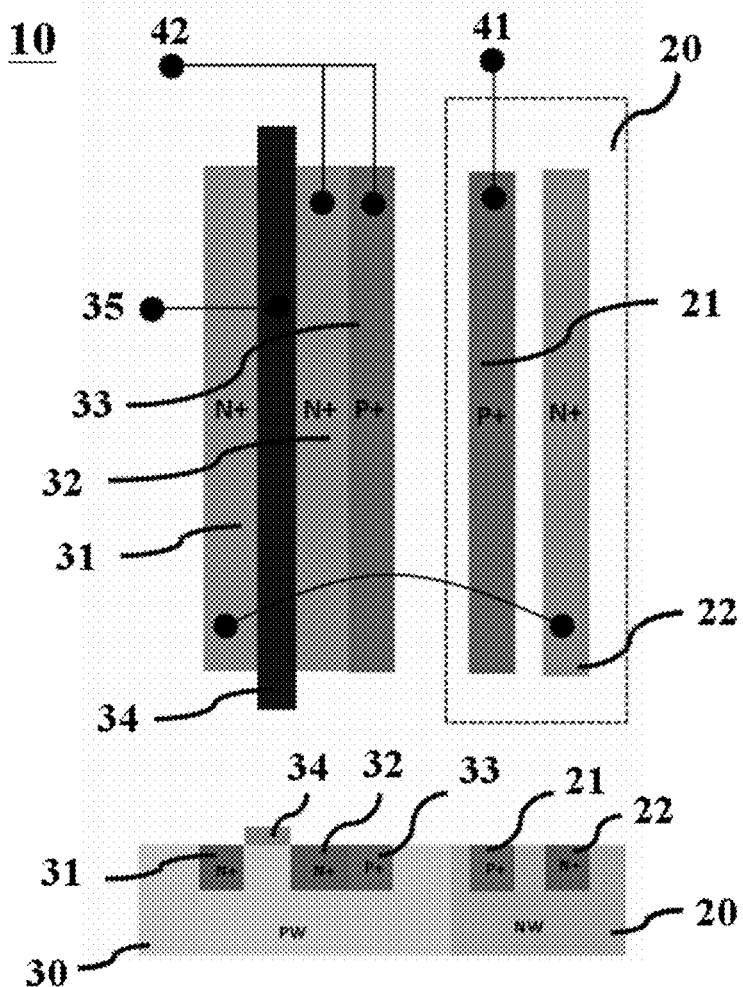
FIG. 3 shows a layout circuit of the ESD protection for a first embodiment of the present invention, wherein top part is top view and bottom part is cross section view.

FIG. 3 shows a layout circuit of the electrostatic discharge (ESD) protection for a first embodiment of the present invention. Top part is top view and bottom part is cross section view. The ESD protection circuit 10 comprises a diode and a MOS transistor which is set on a semiconducting substrate. The ESD protection circuit 10 comprises: a first well 20, a second well 30, a first high doping concentration region 21, a second high doping concentration region 22, a third high doping concentration region 31, a fourth high doping concentration region 32, a fifth high doping concentration region 33, an electrode 34. The first well 20 has a first conducting mode. The second well 30 has a second conducting mode, and is located adjacent to the first well 20. The first high doping concentration region 21 is located in the first well 20 and has a second conducting mode, and the first high doping concentration region 21 is electrically connected to a connected pad 41. The second high doping concentration region 22 is located in the first well 21 and has a first conducting mode, and the second high doping concentration region 22 has a first predetermined distance from the first high doping concentration region 21. The third high doping concentration region 31 is located in the second well 30 and has a first conducting mode. The fourth high doping concentration region 32 is located in the second well 30 and has a first conducting mode. The fourth high doping concentration region 32 has a second predetermined distance from the third high doping concentration region 32, and is electrically connected to a ground pad 42. The fifth high doping concentration region 33 is located in the second well 30 and has a second conducting mode. The fifth high doping concentration region 33 is located adjacent to the fourth high doping concentration region 32 and is electrically the ground pad 42. The electrode 34 is located on a surface of the second well 30 between the third high doping concentration region 31 and the fourth high doping concentration region 32, and the electrode 34 is electrically connected to a trigger point 35. Wherein the second high doping concentration region 22 is electrically connected to the third high doping concentration region 32.

Figure 4:
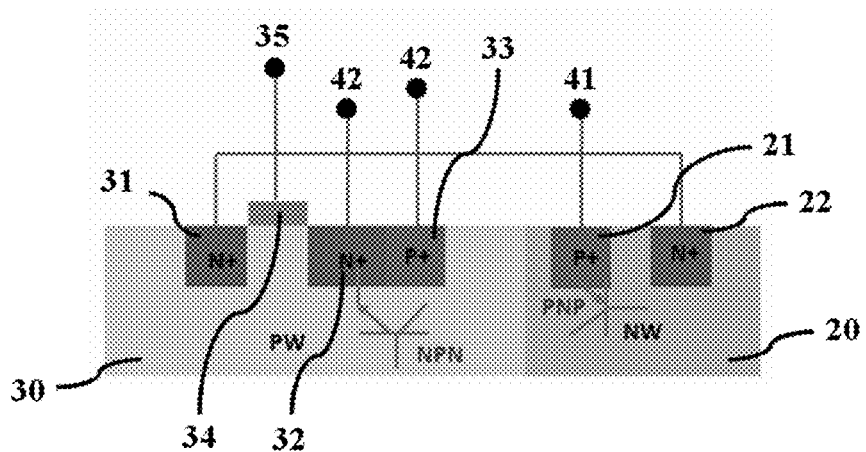
FIG. 4 shows (a) a parasitic SCR circuit diagram and (b) a circuit schematic of the ESD protection for the first embodiment of the present invention.
Figure 4:
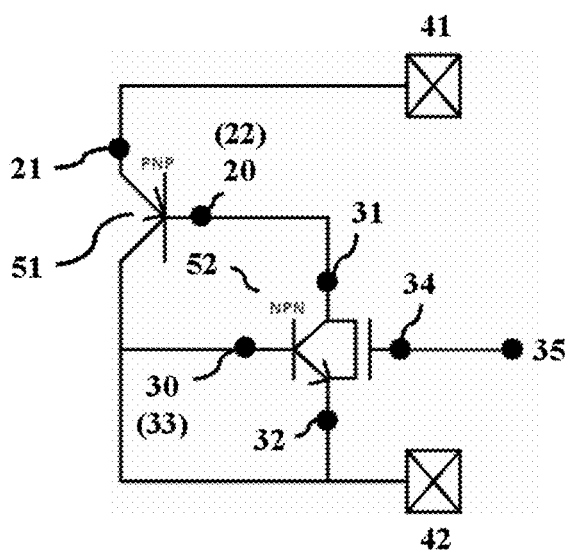
Figure 5:
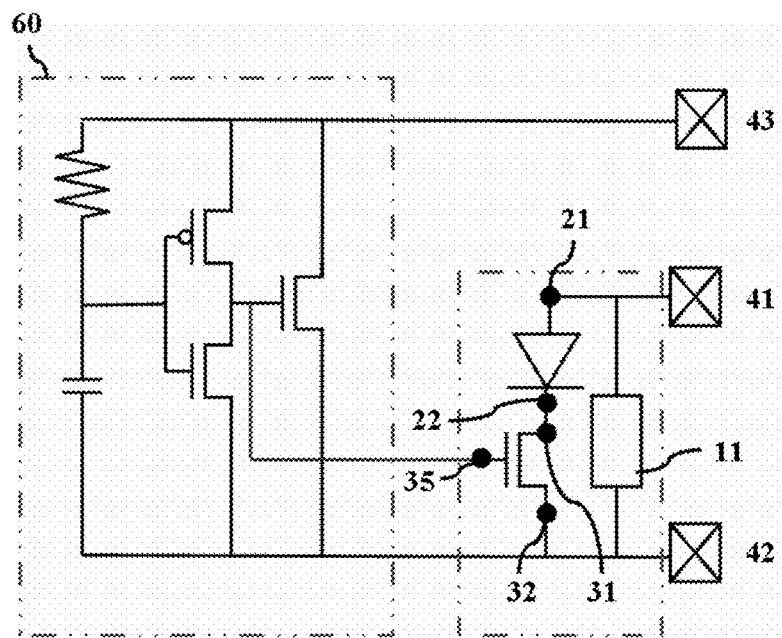
FIG. 5 shows a schematic of a discharging path of the ESD protection circuit for the first embodiment of the present invention.

FIG. 4 shows (a) a parasitic SCR circuit diagram and (b) a circuit schematic of the ESD protection circuit for the first embodiment of the present invention. FIG. 5 shows a schematic of a discharging path of the ESD protection circuit for the first embodiment of the present invention. A parasitic effect between the first high doping concentration region 21, the first well 20 and the second well 30 forms a first bipolar transistor 51, the first high doping concentration region 21 forms as a collector of the first bipolar transistor 51, the first well 20 forms as a base of the first bipolar transistor 51, the second well 30 forms as an emitter of the first bipolar transistor 51.

A parasitic effect between the fourth high doping concentration region 33, the first well 20 and the second well 30 forms a second bipolar transistor 52, the fourth high doping concentration region 33 forms as a collector of the second bipolar transistor 52, the second well 30 forms as a base of the second bipolar transistor 52, the first well 20 formed as an emitter of the second bipolar transistor 52.

According to the above description, a parasitic effect between the first high doping concentration region 21, the fourth high doping concentration region 32, the first well 20 and the second well 30 forms a silicon controlled rectifier (SCR) 11.

Furthermore, an isolating layer having a thickness is located between the electrode 34 and the surface of the second well 34. The third high doping concentration region 31, the fourth high doping concentration region 32 and the electrode 34 forms as a metal-oxide-semiconductor (MOS) field-effect transistor (FET), the electrode 34 forms as a gate of the FET. It is also noted the FET is a metal-oxide-semiconductor (MOS) FET. The fifth high doping concentration region 33 is located closer to the junction of the first well 20 and the second well 30, the fourth high doping concentration region 32 located farther to the junction of the first well 20 and the second well 30, the fifth high doping concentration region 33 is used to adjust a trigger voltage of the trigger point 35.

In a prefer embodiment, the first conducting mode is N-type, and the second conducting mode is P-type. Namely, the ESD protection circuit 10 can be regarded as an ESD protection structure which consists of a P+/NW diode and a NMOS transistor. A parasitic SCR between the two elements is used as the main path for the discharge of ESD current.

Namely, the P+/NW diode, locating on a N-well, includes an high P-doping concentration region and an nonadjacent high N-doping concentration region.

The N-type metal-oxide-semiconductor (NMOS) transistor, locating on a P-well, includes a drain, a source and a gate. The drain and the source are formed by the high N-doping concentration region.

The P-well further includes a high P-doping concentration region near the source, the drain of the NMOS is electrically connected to the high N-doping concentration region of the diode, and the source of the NMOS and the adjacent high P-doping concentration region are electrically connected to a ground, and the gate of the NMOS transistor is electrically connected to a trigger point.

As shown in FIG. 5, the parasitic effect between the high P-doping concentration region of the diode, the N-well, the P-well and the source of the NMOS transistor forms a SCR 11.

A parasitic effect between the high P-doping concentration region of the diode, the N-well and the P-well forms a first bipolar transistor, and the N-well forms as a base of the first bipolar transistor. A parasitic effect between the source of the NMOS transistor, the N-well and the P-well forms a second bipolar transistor, and the P-well forms as a base of the second bipolar transistor, and the first bipolar transistor and the second bipolar transistor form as a SCR 11.

Wherein, the high P-doping concentration region of the P+/NW diode is electrically connected to the connected pad 41, and N+ pin connects with the drain of the NMOS transistor, and the source and bulk of the NMOS transistor connect to the ground, and the poly gate of the electrode 34 connects to the trigger point 35.

FIG. 5 shows a schematic of a discharging path of the ESD protection circuit for the first embodiment of the present invention. When the integrated circuit is operated in general, the trigger point 35 decreases it voltage. Therefore, the NMOS transistor will turn off and eliminate the leakage current.

When the integrated circuit is bombarded by the ESD, the trigger point 35 increase it voltage. Therefore, the NMOS transistor will turn on and drive the leakage current through the first parasitic bipolar transistor 51 (PNP), and passing through the channel of the NMOS transistor to the ground pad 42. Due to the current of the first parasitic bipolar transistor 51 (PNP), a voltage is created at the base of the second bipolar transistor 52 (NPN). Therefore, the second parasitic bipolar transistor 51 (NPN) turns on, and driving most ESD current to the ground pad 42 through the SCR path. The trigger point 35 can be set up by a signal of a power clamp 60 instead of additional trigger circuits, as shown in FIG. 5. The Power clamp 60 is mainly connected between the high voltage terminal 43 (VDD) and the ground pad 42, which consists of capacitors (or the parasitic capacitors), resistors and transistors. When the high voltage terminal 43 exhibits a large offset and creates a leakage current, the leakage current can be derived to the power clamp circuit and then charge the capacitors. When the voltage becomes stable, the resistors can be used to discharge the capacitors.

Figure 6:
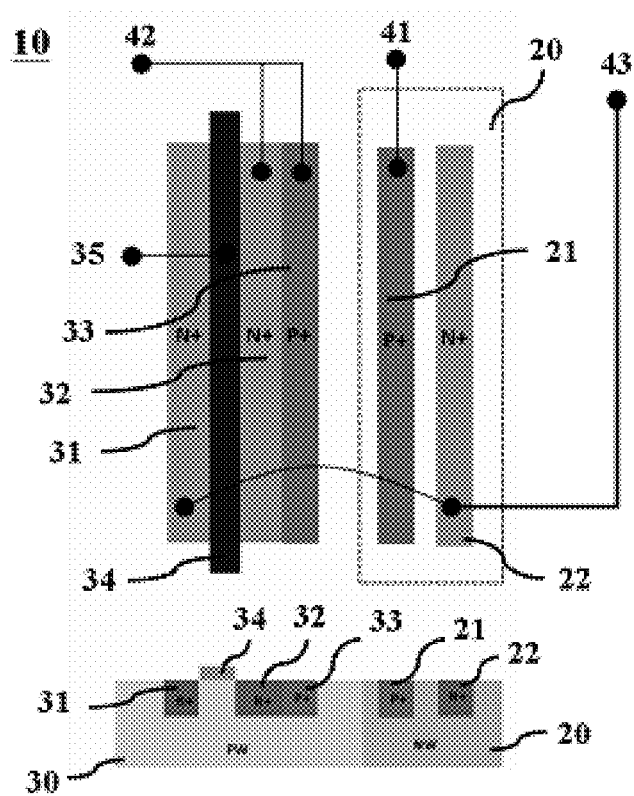
FIG. 6 shows a layout circuit of the ESD protection for a second embodiment of the present invention, wherein top part is top view and bottom part is cross section view.
Figure 7:
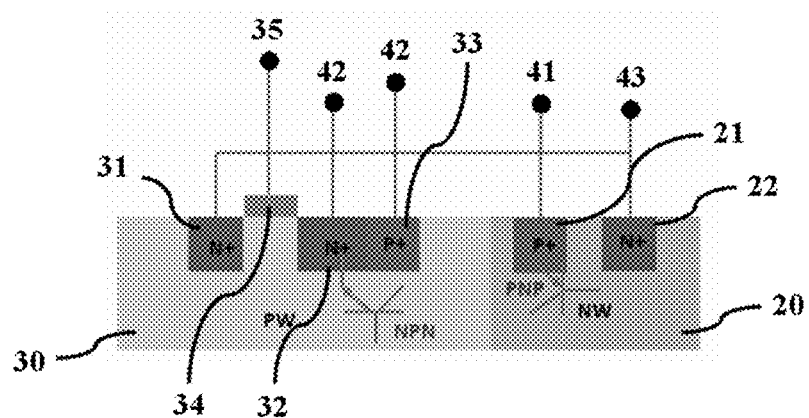
FIG. 7 shows (a) a parasitic SCR circuit diagram and (b) a circuit schematic of the ESD protection for the second embodiment of the present invention.
Figure 7:
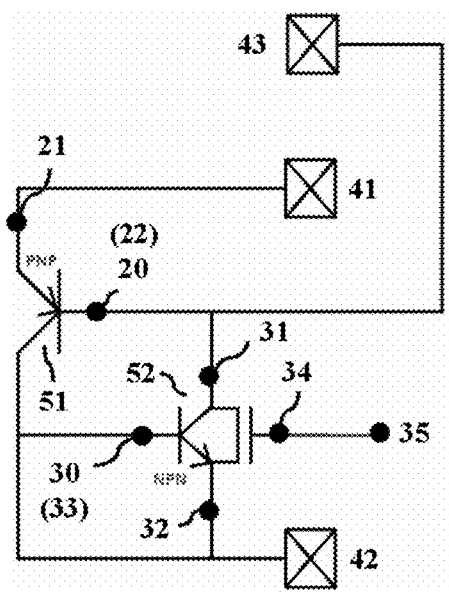

FIG. 6 shows a layout circuit of the electrostatic discharge (ESD) protection for a second embodiment of the present invention. Top part is top view and bottom part is cross section view. FIG. 7 shows (a) a parasitic SCR circuit diagram and (b) a circuit schematic of the ESD protection for the second embodiment of the present invention. The circuit structure of the second embodiment of the present invention is similar to the circuit structure of the first embodiment of the present invention. The diversity between the first embodiment and the second embodiment is that the high N-doping concentration region of the P+/NW diode is electrically connected to the drain of the NMOS transistor and the voltage terminal 43 (VDD) simultaneously. Namely, both of the second high doping concentration region 22 and the third high doping concentration region 31 are electrically connected to a high voltage terminal 43. Therefore, an ESD protection is pulled up, and a SCR is used as the protection element resulted from the parasitic effect between the connected pad 41 and the ground pad 42. In addition, a low parasitic capacitance is obtained according to a comparison with another embodiment.

Figure 8:
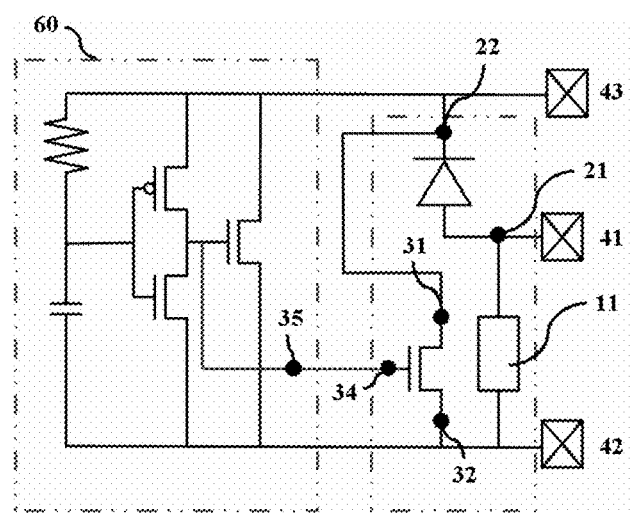
FIG. 8 shows a schematic of a discharging path of the ESD protection circuit for the second embodiment of the present invention.

FIG. 8 shows a schematic of a discharging path of the ESD protection circuit for the second embodiment of the present invention. When the integrated circuit is operated in general, the trigger point 35 decreases it voltage. Therefore, the NMOS transistor will turn off and eliminate the leakage current.

When the integrated circuit is bombarded by the PD mode ESD, the current can be derived based on a forward biasing path of the P+/NW diode. When the integrated circuit is bombarded by the PS mode ESD, the current can be derived based on two paths. For the first path, the current is derived to the high voltage terminal 43 through the P+/NW diode, and then passes the power clamp 60 into the ground pad 42. For the second path, the power clamp 60 is used to create a trigger signal to the trigger point 35, and turns on the parasitic SCR 11 for the demand of driving the current. When the integrated circuit is bombarded by the ND and NS mode ESD, the current can be derived based on the power clamp 60 and the parasitic diode of the NMOS transistor.

Wherein, PS-mode means that low voltage terminal $V_{SS}$ connects with ground, a positive ESD voltage occurs at the pins and discharges the current to the low voltage terminal $V_{SS}$. At this moment, the high voltage terminal $V_{DD}$ terminal and the other pins are floating.

NS-mode means that low voltage terminal $V_{SS}$ connects with ground, a negative ESD voltage occurs at the pins and discharges current to the low voltage terminal $V_{SS}$. At this moment, the high voltage terminal $V_{DD}$ terminal and the other pins are floating.

PD-mode means that high voltage terminal $V_{DD}$ connects with ground, a positive ESD voltage occurs at the pins and discharges current to the high voltage terminal $V_{DD}$. At this moment, the low voltage terminal $V_{SS}$ terminal and the other pins are floating.

ND-mode means that high voltage terminal $V_{DD}$ connects with ground, a negative ESD voltage occurs at the pins and discharges current to the high voltage terminal $V_{DD}$. At this moment, the low voltage terminal $V_{SS}$ terminal and the other pins are floating.

The present invention satisfies the requirement of low capacitances for RF ESD protection. In addition, the low SCR trigger voltage and the improved tolerance of the voltage operation is accomplished. Namely, the leakage current is eliminated effectively during the operation.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. An electrostatic discharge protection circuit, formed by a diode and a metal-oxide-semiconductor (MOS) transistor set on a semiconducting substrate, comprising:
    a first well, having a first conducting mode;
    a second well, locating adjacent to the first well and having a second conducting mode;
    a first high doping concentration region, locating in the second well and having a second conducting mode, the first high doping concentration region electrically connected to a connected pad;
    a second high doping concentration region, locating in the second well and having a first predetermined distance from the first high doping concentration region, having a first conducting mode;
    a third high doping concentration region, locating in the second well and having a first conducting mode;
    a fourth high doping concentration region, locating in the first well and having a second predetermined distance from the third high doping concentration region, having a first conducting mode, the fourth high doping concentration region electrically connected to a ground pad;
    a fifth high doping concentration region, locating in the first well and locating adjacent to the fourth high doping concentration region, having a second conducting mode, the fifth high doping concentration region electrically connected to the ground pad; and an electrode, locating on a surface of the second well between the third high doping concentration region and the fourth high doping concentration region, the electrode electrically connected to a trigger point;
    wherein the second high doping concentration region is electrically connected to the third high doping concentration region.

2. An electrostatic discharge protection circuit as claimed in claim 1, wherein the first conducting mode is N-type, the second conducting mode is P-type.

3. An electrostatic discharge protection circuit as claimed in claim 1, wherein a parasitic effect between the first high doping concentration region, the first well and the second well forms a first bipolar transistor, the first high doping concentration region forms as a collector of the first bipolar transistor, the first well forms as a base of the first bipolar transistor, and the second well forms as an emitter of the first bipolar transistor.

4. An electrostatic discharge protection circuit as claimed in claim 1, wherein a parasitic effect between the fourth high doping concentration region, the first well and the second well forms a second bipolar transistor, the fourth high doping concentration region forms as a collector of the second bipolar transistor, the second well forms as a base of the second bipolar transistor, the first well forms as an emitter of the second bipolar transistor.

5. An electrostatic discharge protection circuit as claimed in claim 1, wherein a parasitic effect between the first high doping concentration region, the fourth high doping concentration region, the first well and the second well parasitically forms a silicon controlled rectifier (SCR).

6. An electrostatic discharge protection circuit as claimed in claim 1, wherein a first parasitic effect between the first high doping concentration region, the first well and the second well forms a first bipolar transistor, the second well forms as a base of the first bipolar transistor, a second parasitic effect between the fourth high doping concentration region, the first well and the second well forms a second bipolar transistor, the first well forms as a base of the second bipolar transistor, and the first bipolar transistor and the second bipolar transistor form as a silicon controlled rectifier (SCR).

7. An electrostatic discharge protection circuit as claimed in claim 1, wherein an isolating layer having a thickness is located between the electrode and the surface of the first well.

8. An electrostatic discharge protection circuit as claimed in claim 1, wherein the third high doping concentration region, the fourth high doping concentration region and the electrode forms as a metal-oxide-semiconductor (MOS) field-effect transistor (FET), the electrode formed as a gate of the FET.

9. An electrostatic discharge protection circuit as claimed in claim 1, wherein the fifth high doping concentration region is located closer to the junction of the first well and the second well than the fourth high doping concentration region, and the fifth high doping concentration region is used to adjust a trigger voltage of the trigger point.

10. An electrostatic discharge protection circuit as claimed in claim 1, wherein the second high doping concentration region and the third high doping concentration region electrically connect to a point with high voltage.

11. An electrostatic discharge protection circuit, comprising:
    a diode, locating on a N-well, including a high P-doping concentration region and a nonadjacent high N-doping concentration region;
    a N-type metal-oxide-semiconductor (NMOS) transistor, locating on a P-well, including a drain, a source and a gate, the drain and the source formed by the high N-doping concentration region;
    wherein the P-well further comprises a high P-doping concentration region adjacent to the source, the drain of the NMOS is electrically connected to the high N-doping concentration region of the diode, the source of the NMOS and the adjacent high P-doping concentration region are electrically connected to a ground, the gate of the NMOS transistor electrically connected to a trigger point.

12. An electrostatic discharge protection circuit as claimed in claim 11, wherein the drain of the NMOS transistor and the high N-doping concentration region of the diode are electrically connected to a point with high voltage.

13. An electrostatic discharge protection circuit as claimed in claim 11, wherein a parasitic effect between the high P-doping concentration region of the diode, the N-well, the P-well and the source of the NMOS transistor forms a silicon controlled rectifier (SCR).

14. An electrostatic discharge protection circuit as claimed in claim 11, wherein a first parasitic effect between the high P-doping concentration region of the diode, the N-well and the P-well forms a first bipolar transistor, the N-well forms as a base of the first bipolar transistor, a second parasitic effect between the source of the NMOS transistor, the N-well and the P-well forms a second bipolar transistor, the P-well forms as a base of the second bipolar transistor, the first bipolar transistor and the second bipolar transistor form as a silicon controlled rectifier (SCR).

* * * * *